US010725862B2

(12) United States Patent
Cheng et al.

(10) Patent No.: US 10,725,862 B2
(45) Date of Patent: Jul. 28, 2020

(54) DATA RECOVERY METHOD TO ERROR CORRECTION CODE IN MEMORY

(71) Applicant: MACRONIX INTERNATIONAL CO., LTD., Hsinchu (TW)

(72) Inventors: Chia-Feng Cheng, Changhua (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 14 days.

(21) Appl. No.: 16/029,344

(22) Filed: Jul. 6, 2018

(65) Prior Publication Data
US 2020/0012560 A1 Jan. 9, 2020

(51) Int. Cl.
*G06F 11/10* (2006.01)
*G06F 3/06* (2006.01)
*G11C 29/52* (2006.01)

(52) U.S. Cl.
CPC .......... *G06F 11/1068* (2013.01); *G06F 3/064* (2013.01); *G06F 3/0619* (2013.01); *G06F 3/0656* (2013.01); *G06F 3/0659* (2013.01); *G06F 3/0679* (2013.01); *G11C 29/52* (2013.01)

(58) Field of Classification Search
CPC .... G06F 11/1068; G06F 3/0619; G06F 3/064; G06F 3/0656; G06F 3/0659; G06F 3/0679; G11C 29/52
See application file for complete search history.

(56) References Cited

U.S. PATENT DOCUMENTS

| 7,805,662 B2 | 9/2010 | Ma et al. |
| 9,773,571 B2 | 9/2017 | Lo et al. |
| 2005/0044467 A1 | 2/2005 | Leung et al. |
| 2009/0113272 A1* | 4/2009 | Tan ............... G06F 11/1052 714/765 |
| 2011/0157992 A1* | 6/2011 | Strasser ............. G06F 13/426 365/185.18 |
| 2011/0182119 A1* | 7/2011 | Strasser ............. G11C 16/28 365/185.03 |

(Continued)

FOREIGN PATENT DOCUMENTS

TW 200731230 A 8/2007
TW 201442035 A 11/2014

OTHER PUBLICATIONS

TW Office Action from family member TW Application No. 107129507 dated Jun. 11, 2019, 4 pages.

*Primary Examiner* — Kyle Vallecillo
(74) *Attorney, Agent, or Firm* — Haynes Beffel & Wolfeld LLP

(57) ABSTRACT

An integrated circuit comprising a memory array configured to store data chunks with corresponding error correction codes and error correction logic includes control logic that executes a recovery procedure to access a selected data chunk and corresponding error correction code from the memory array, to utilize the error correction logic to identify a location in the memory array of an error bit in the selected data chunk, and to access the identified location to write the corrected data. The recovery procedure is sequentially applied to a plurality of data chunks over a recovery operation region designated for a given instance of the recovery operation. Memory coupled with the control logic can store one or more recovery parameters that identify the recovery operation region in the memory.

22 Claims, 8 Drawing Sheets

(56) References Cited

U.S. PATENT DOCUMENTS

| | | | |
|---|---|---|---|
| 2012/0260148 A1* | 10/2012 | Hughes | G06F 11/1068 |
| | | | 714/773 |
| 2013/0265823 A1 | 10/2013 | Ajika et al. | |
| 2013/0275656 A1* | 10/2013 | Talagala | G06F 12/0246 |
| | | | 711/103 |
| 2014/0056068 A1* | 2/2014 | Strasser | G06F 11/1048 |
| | | | 365/185.03 |
| 2014/0325311 A1 | 10/2014 | Lo et al. | |
| 2015/0046771 A1* | 2/2015 | Kim | H03M 13/1128 |
| | | | 714/764 |
| 2015/0286527 A1* | 10/2015 | Wu | G11C 11/5642 |
| | | | 714/773 |
| 2015/0332771 A1 | 11/2015 | Kwon et al. | |
| 2015/0363257 A1 | 12/2015 | Kwon et al. | |
| 2016/0041891 A1* | 2/2016 | Malshe | G06F 11/2094 |
| | | | 714/704 |
| 2016/0098216 A1 | 4/2016 | Huang et al. | |
| 2016/0117218 A1* | 4/2016 | Chang | G06F 11/1004 |
| | | | 714/807 |
| 2016/0247578 A1 | 8/2016 | Yun | |
| 2017/0249208 A1* | 8/2017 | Kim | G06F 3/0619 |
| 2017/0286219 A1* | 10/2017 | Chae | G06F 3/0619 |
| 2019/0129654 A1* | 5/2019 | Kim | G06F 3/0659 |
| 2019/0347159 A1* | 11/2019 | Chang | G06F 11/1048 |

\* cited by examiner

DATA RECOVERY METHOD TO ERROR CORRECTION CODE IN MEMORY

BACKGROUND

Field

The present invention relates to technology to improve data retention in memory devices, including flash memory or other types of nonvolatile memory.

Description of Related Art

Data retention in nonvolatile memory devices is an important operating characteristic. Specifically, data stored in a nonvolatile memory cell is represented by a relatively stable condition of the cell. For example, in flash memory, the data stored in the cell is represented by charge trapped in a floating gate or dielectric charge trapping structure. For another example, in phase change memory, the data stored in the cell is represented by the solid-state phase of the memory element. The data retention parameter relates to the ability of the memory cell to maintain that relatively stable condition over time.

Procedures to write data in nonvolatile memory often are configured to store data with sufficient margin that any shifts in the condition of the cell (e.g., charge loss or charge gain, phase change, etc.) during normal use are unlikely to result in data loss. However, as the dimensions of nonvolatile memory cells shrink, the density of the memory arrays using such devices increase, and operating voltages become smaller, data retention specifications are under pressure.

For high density nonvolatile memory, error correction technologies have been deployed to accommodate errors in the data that can occur when individual cells do not store correct data. In this way, when the data is read out from the array, the erroneous data can be corrected in the data output to the requesting host.

Error correction technology includes the use of error correction code ECCs, also called error correcting codes or Hamming codes, with corresponding chunks of data. ECCs are basically bits of data added to provide redundancy to a data chunk, by which a specified number of errors can be identified and corrected in the chunk when it is read back. Error detection logic using ECCs can be applied to correct error bits encountered in data that is actively in use and subject of a read or a write operation that identifies the error bits. See, RESISTIVE MEMORY DEVICE AND OPERATING METHOD, Kwon et al., US 2015/0363257, published 17 Dec. 2015.

While this technique is effective for conditions of low bit error rate, and for data in active use, the erroneous data in the memory can accumulate over time. Error correction codes can only correct limited amounts of error bits in a given chunk of data. Thus, techniques have arisen to monitor the bit error rate encountered in a nonvolatile device, and to restore the data when the bit error rate approaches a limit. See for example, SYSTEM AND METHOD FOR REFRESHING DATA IN A MEMORY DEVICE, Huang, et al., US 2016/0098216, published 7 Apr. 2016.

It is desirable to provide a technology to recover data in memory cells that had been successfully programmed but did not retain their data, in a way that minimizes interference with mission function operation of the memory, and that effectively improves data retention characteristics.

SUMMARY

For an integrated circuit comprising a memory array and error correction logic, a recovery procedure is described that is executable as a background operation or otherwise with little or no interference with mission function use of the data stored in the memory array.

An integrated circuit is described comprising a memory array configured to store data chunks with corresponding error correction codes. Error correction logic on the integrated circuit is included, to process data chunks received from the memory array using the corresponding error correction codes to identify locations of errors in the received data chunks. Control logic on the integrated circuit executes a recovery procedure to access a selected data chunk and corresponding error correction code from the memory array, to utilize the error correction logic to identify a location in the memory array of an error bit in the selected data chunk, and to access the identified location to write the corrected data in the memory array.

The recovery procedure can be applied sequentially to a plurality of data chunks over a recovery operation region designated for a given instance of the recovery operation. A parameter store coupled with the control logic can store one or more recovery parameters that identify the recovery operation region in the memory array.

In an embodiment described, a page buffer is operatively coupled to the memory array, and write logic is operatively coupled to the page buffer, and provides logical control for write and verify procedures using the page buffer in response to write commands to store data chunks in the memory array. In this embodiment, the recovery procedure, which is not part of the write procedure, loads the error bit location in the page buffer to identify the location in the memory array of the error bit in the selected data chunk, and applies a write bias pulse and verify cycle to write corrected data using the page buffer.

Also, an embodiment is described in which the integrated circuit includes an interface to receive commands from an external host, and logic to execute a write procedure in response to a command from the external host, to write data into a write operation region of the memory array. In this example, the control logic to execute the recovery procedure is responsive to a current instance of the write procedure, to identify a recovery operation region different than the write operation region in the memory array, and to select the data chunk for the recovery procedure from the recovery operation region. The write procedure can be characterized by a time duration specification that includes excess time for at least some instances of the write procedure. The control logic can include logic to sequentially apply the recovery procedure to a plurality of data chunks in the recovery operation region in response to the current instance within excess time in the time duration specification. Also, the write procedure can write blocks of data having different sizes, and the size of the recovery operation region can be a function of the size of the block written during the current instance of the write procedure.

Also, an embodiment is described in which the integrated circuit includes logic to enter a standby mode between read and write procedures. In this example, the control logic to execute the recovery procedure can apply the recovery procedure during the standby mode.

In another embodiment, the integrated circuit includes logic to execute a power-on process after interruption in power applied to the integrated circuit. The power-on process results in entering an enabled state for operation of the memory. In this embodiment, the control logic to execute the recovery procedure applies the recovery process as part of the power-on process before entering the enabled state.

In yet another embodiment, the control logic can be responsive to a recovery operation command received from an external host to execute the recovery procedure.

In general, a method for operating a memory on an integrated circuit is described. The method comprises storing data chunks with corresponding error correction codes in the memory; and executing a recovery procedure to access a selected data chunk and corresponding error correction code from the memory, to utilize error correction logic on the integrated circuit to identify a location in the memory of an error bit in the selected data chunk, and to access the identified location in the memory to write the corrected data.

The method can be applied in a manner that does not interfere with, or minimizes interference with, mission function utilization of data in the memory, aspects of which can be performed in an integrated circuit such as summarized above.

Other aspects and advantages of the present invention can be seen on review of the drawings, the detailed description and the claims, which follow.

DETAILED DESCRIPTION

A detailed description of embodiments of the present invention is provided with reference to the FIGS. 1-9.

Figure 1:
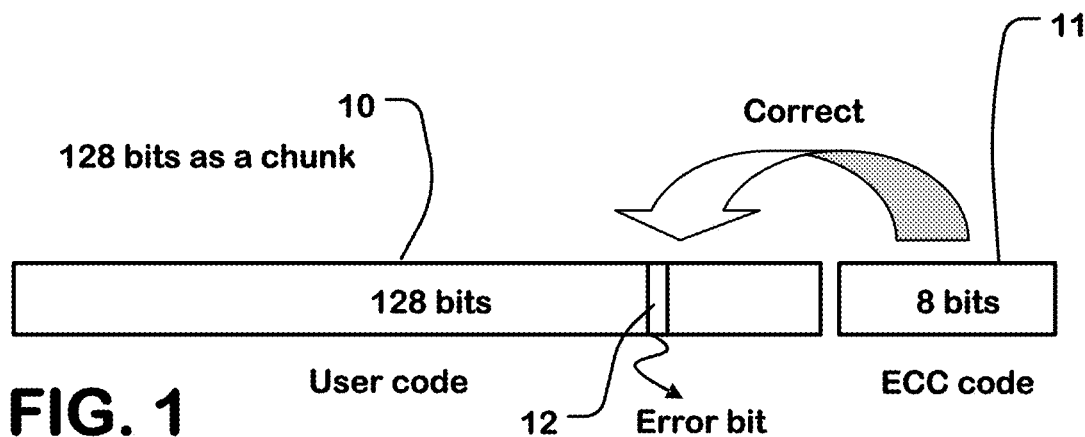
FIG. 1 is an illustration referred to in the explanation of the use of error correction codes with chunks of data.

FIG. 1 is a simplified illustration of a data chunk 10, which can be mission-critical data such as user code, with a corresponding ECC code 11. Error correction logic receiving the chunk 10 of data and the ECC code 11 can identify a location 12 of an error bit in the chunk 10, which can be corrected when the data is provided to a requesting host.

Figure 2A:
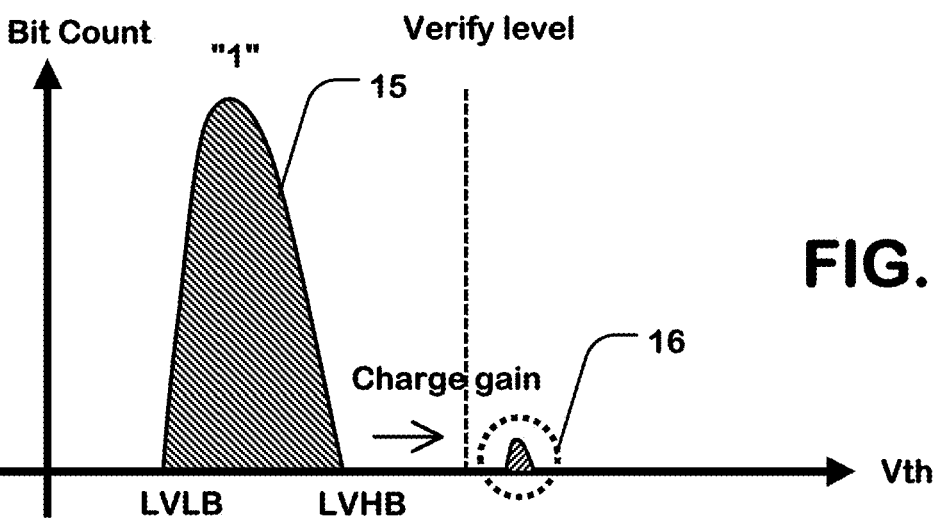
FIG. 2A illustrates one mechanism of data loss due to unwanted charge gain, which can result in poor data retention.
Figure 2B:
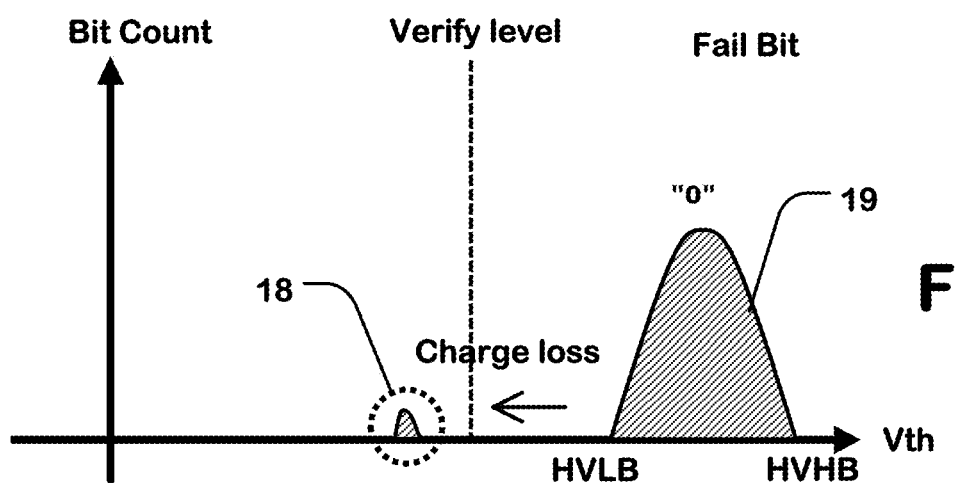
FIG. 2B illustrates a mechanism of data loss due to unwanted charge loss, which can result in poor data retention.

FIG. 2A and FIG. 2B illustrate an example of data loss which can occur in memory cells that have been properly programmed. For example, in FIG. 2A, memory cells in a flash memory device in an erased state storing for example a logic "1" have a threshold voltage Vt in a low threshold range 15 between a low boundary LVLB and a high boundary LVHB. During the erase process, all the cells are properly erased by being verified as having thresholds below a verify level as indicated in the figure. Over time, however, some cells in the array having the array state may gain charge due to disturbance from programming operations in neighboring cells, environmental disturbances and so on. Thus, over time, a number of cells may have thresholds in a range 16, and may be erroneously read as storing a data value "0".

In FIG. 2B, memory cells in a flash memory device in a programmed state storing, for example, a logic "0" have a threshold voltage Vt in a high threshold range 19 between a low boundary HVLB and a high boundary HVHB. During the program process, all the cells are properly programmed by being verified as having thresholds above a verify level as indicated in the figure. Over time, however, some cells in the array having the array state may lose charge due to disturbance from erasing operations in neighboring cells, environmental disturbances, and so on. Thus, over time, a number of cells may have thresholds in a range 18, and may be erroneously read as storing a data value "1".

Recovery procedures are described herein by which the cells having thresholds in the range 16 of FIG. 2A, and the cells having thresholds in the range 18 of FIG. 2B can be restored to their appropriate threshold ranges.

Figure 3:
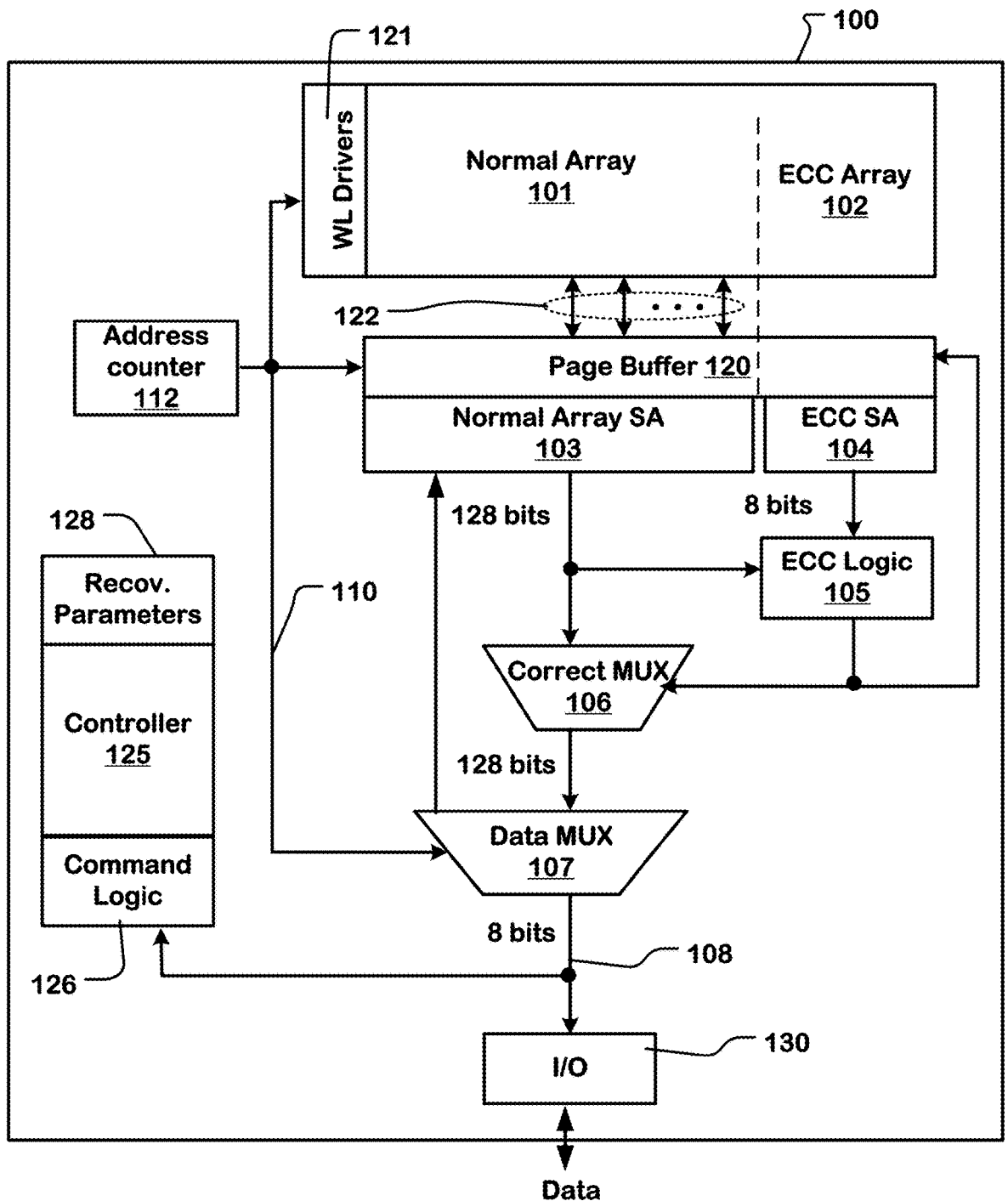
FIG. 3 is a simplified block diagram of an integrated circuit including a memory array, and control logic for executing a recovery procedure as described herein.

FIG. 3 is a simplified diagram of an integrated circuit 100 including a nonvolatile memory and a controller configured to execute a recovery procedure as described herein. An integrated circuit 100 for the purposes of the disclosure is a single chip device, or a multi-chip device, in a single integrated circuit package provided as a unit.

In this example, the integrated circuit 100 includes a flash memory that comprises a first portion characterized as a normal array 101 and a second portion characterized as an ECC array 102. The normal array 101 stores chunks of data while the ECC array 102 stores ECC's for corresponding chunks of data in the normal array 101. The ECCs are computed and stored with the chunks of data during programming so that they accurately reflect the contents of the corresponding data chunks.

A set of sense amplifiers 103 is operatively coupled via lines 122 with the normal array 101, and a set of sense amplifiers 104 is operatively coupled via lines 122 with the ECC array 102. In this example, a page buffer 120 is operatively coupled to the memory array in the sense that data is moved thought the page buffer and utilized during sensing and programming of data into the normal array 101 and ECC array 102. Likewise, the sense amplifiers 104 are operatively coupled to the arrays 101 and 102, in the sense that they are used in the sensing of data stored in the array. Also, word line drivers 121 are associated with the normal array 101 and ECC array 102. The arrangement of sense amplifier and page buffers illustrated is like that in some NAND architecture devices. The arrangement varies in different embodiments, including embodiments configured for NOR architecture devices and for other memory technologies.

The integrated circuit 100 includes an address counter 112 or other address logic, that is used to provide addresses on line 110 to word line drivers 121, to the page buffer 120, or other type of column decoder, and to the output data multiplexer 107. The address counter 112 can be controlled by an on-chip controller 125. Also, the address counter 112 can be utilized by the output data multiplexer 107 to control the outputting of a chunk of data to the external host.

The integrated circuit also includes circuitry for providing bias voltages necessary for programming, erasing and reading in the case of flash memory, or for setting, resetting and reading in the case of other types of nonvolatile memory. The circuitry for providing bias voltages can include charge pumps, voltage dividers, current sources, voltage regulators and other circuit elements suitable for implementation on integrated circuits.

The sense amplifiers 103 and 104 are arranged to provide the chunks of data (which can be for example 128 bits) and the corresponding ECCs (which can be for example 8 bits) to ECC logic 105. Also, the set of sense amplifiers 103 coupled with the normal array is arranged to provide its output data to a correction multiplexer 106, which can be in the form of a cache memory, for example. The ECC logic 105 generates an output that identifies the locations of error bits in the corresponding chunk and provides the locations to the correction multiplexer 106, where the erroneous bits are corrected. The output of the correction multiplexer 106 is a corrected chunk of data applied to an output data multiplexer 107, where the chunk can be provided to an input/output interface 110 as a sequence of 8-bit bytes for example. The input/output interface 110 can provide data to an external host, using a bus protocol specified for the particular embodiment.

The input/output interface 110 can also receive data from an external host for writing into the memory array. Thus, in the block diagram, a data path from the data multiplexer 107 to the sense amplifiers 103, 104 and page buffer 120 is illustrated. During a write operation, the page buffer 120 can be loaded with a data pattern including a data chunk and a corresponding ECC, which can be programmed and verified according to the procedures appropriate for the type of memory technology. The page buffer can store one chunk and one corresponding ECC, in some embodiments. In other embodiments, the page buffer may store more than one chunk and more than one corresponding ECC. The size of the page buffer 120 can be designed as suits a particular implementation of the technology, with consideration of the type of ECC logic utilized along with other characteristics of the memory device.

The input/output interface 130 is coupled in this example also to command logic 126, in which commands from an external host can be decoded and applied to a controller 125 on the integrated circuit.

The command logic 126 may generate internal control signals that are applied to controller 125.

The controller 125 can comprise one or more state machines or other logic constructs by which control signals are generated and applied to components of the memory for the purposes of executing embedded operating procedures, including write procedures and read procedures. For flash memory, the write procedures can include programming procedures and erasing procedures.

The controller 125 can be implemented using special-purpose logic circuitry, programmable logic circuitry, a general purpose processor with control code stored on the integrated circuit executed to implement the controller 125, and by a combination of such elements. A state machine or state machines in the controller 125 can be configured to execute embedded operating procedures by applying appropriate timing and control signals to the various circuitry components of the device.

A write procedure implemented by the controller 125 can include so-called incremented stepped pulse programming ISPP, which includes loading the page buffer with the data pattern to be programmed, and iteratively applying a programming pulse to bit lines identified in the page buffer with an inhibit bias applied to unselected bit lines, followed by a verify step until the data pattern is successfully programmed. In each iteration, when a bit is successfully verified, its corresponding bit in the page buffer is reset so that it receives an inhibit bias in subsequent iterations. Also, in each iteration, the amplitude of the programming pulse can be incremented or otherwise varied.

Also, an erase procedure can be implemented by a state machine on the controller 125 by applying appropriate timing and control signals to the various circuitry components of the device. An erase procedure can be applied on a segment-by-segment or block-by-block basis to flash memory. An erase procedure can include erase verify operations after each erase pulse.

According to embodiments of the technology described herein, the controller 125 includes a state machine or other logic, configured to execute a recovery procedure by applying appropriate timing and control signals to the various circuitry components of the device. A recovery procedure as described herein is executed to access a selected data chunk and corresponding ECC from the memory array, to utilize the ECC logic 105 to identify a location in the memory array of an error bit in the selected data chunk, and to access the identified location to write corrected data back to the memory array. In the embodiment illustrated in the figure, the ECC logic 105 is configured to provide data identifying the location of the error bit to the page buffer 120. The controller 125 can cause a program pulse to be applied to a bit line identified by the location data in the page buffer 120 in order to recover the error bit by writing corrected data. In another example, the locations of error bits can be stored in a table during an error identification phase of the recovery procedure, which can be utilized to feedback corrected data to the page buffer in a subsequent recovery phase of the recovery procedure.

As illustrated in FIG. 3, parameter store memory 128 for storing one or more parameters of a recovery operation is coupled with the controller 125. These parameters can include a pointer to a recovery operation region of the memory, where a recovery operation region of the memory corresponds to an address space which can be traversed during a recovery procedure, and within which a given instance of the recovery operation is to be executed. Also, the parameters can include status information about a current recovery operation region, or about recovery status of memory locations in the array. These parameters can be utilized by the controller 125 to manage execution of the recovery operation in a way to effectively improve the data retention characteristics of the device.

The controller 125 can be configured to maintain operating modes which affect, among other operations, the interpretation of commands received from an external host. For example, the controller can enter a standby mode between read and write operations in which the state machine is configured to respond to external host commands as quickly as possible. The controller can maintain a read mode, during a read procedure, during which external host commands may be queued or blocked. Likewise, the controller can maintain program and erase modes with various impacts on execution of external host commands. Controller 125 can also include logic to execute a power-on procedure after interruption in power applied to the integrated circuit. The power-on procedure can include energizing circuitry on the device and result in entering an enable state, which can comprise a standby mode for example, in which the state machine is in a condition to execute procedures using the memory. In an embodiment described herein, the controller 125 is configured to execute the recovery procedure described herein before entering the enable state in which external commands are accepted.

In one example, the memory comprises a flash memory such as a high-density NAND flash memory. Other types of memory technologies can be utilized as well, including phase change memory PCM, programmable resistance memory known as ReRAM or RRAM, NOR flash memory, magnetoresistive memory, and so on. Also, other types of memory technologies can be utilized, including volatile memory such as DRAM or SRAM.

Figure 4:
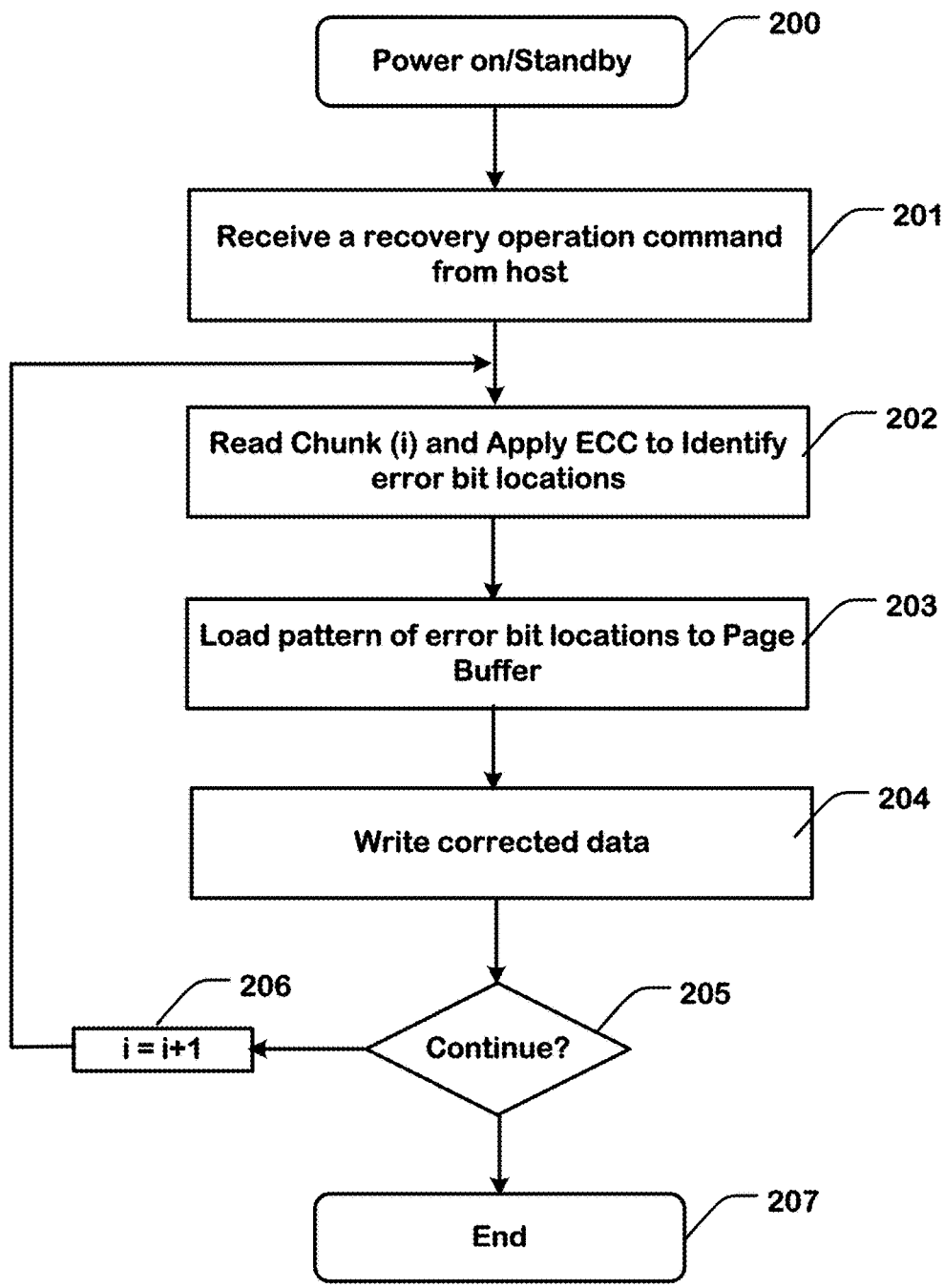
FIG. 4 is a flowchart of a recovery procedure executed by control logic according to one embodiment described herein.

FIG. 4 illustrates a recovery procedure executed in an embodiment in which the integrated circuit includes an interface to receive commands from an external host, and the control logic is responsive to a recovery operation command from an external host to execute the recovery procedure. The recovery operation command can be received at an input/output interface in coordination with control signals, such as a chip select signal and a clock signal. In an example, the recovery operation command includes a sequence of data that comprises an operation code of one or two bytes that identify the recovery operation. The command sequence can include an address that includes a sufficient number of bits to identify a recovery operation region. Alternatively, the recovery operation region can be identified by parameters maintained by the controller on the integrated circuit, or stored on the integrated circuit by a parameter write operation. The command logic on the integrated circuit decodes the recovery operation command and provides the appropriate signals to the controller which executes an embedded recovery procedure.

Thus, as illustrated in FIG. 4, after a power-on, or during a standby mode, the integrated circuit can be in a condition (200) waiting for a command. In this condition, a recovery operation command can be received from an external host (201). The recovery procedure can use an address pointer that identifies a chunk labeled "chunk(i)" in the diagram, of data within a recovery operation region of the memory to access a selected chunk and the corresponding error correction code from the memory array, and utilize the ECC logic to identify error bit locations in the chunk (block 202). The recovery procedure can load a pattern of error bit locations into the page buffer or other store (203). The recovery procedure can then write corrected data to the identified locations (204). In a flash memory or other types of memory, the recovery procedure may only correct errors by changing the data stored from logic "1" to a logic "0" (erased to programmed state). In some embodiments, the recovery procedure may include steps to correct any type of error. After writing corrected data for the current chunk, the recovery procedure can determine whether to continue to a next chunk (block 205). This determination can be based on recovery parameters stored on the integrated circuit, such as parameters identifying an extent of a recovery operation region (e.g. a beginning and an ending address) to be traversed in the current instance of the recovery procedure, parameters identifying a time interval within which the recovery procedure is allowed to execute, or other parameters as suits a particular implementation.

If it is decided to continue with the recovery procedure, then an index "i" is incremented (206), and the procedure loops back to block 202 to continue until the current instance of the recovery procedure is completed. If it is decided at block 205 that the current instance of the recovery procedure is completed, then the recovery procedure ends (207). After the recovery procedure ends, the controller can return to a standby mode, or other appropriate operating mode.

Figure 5:
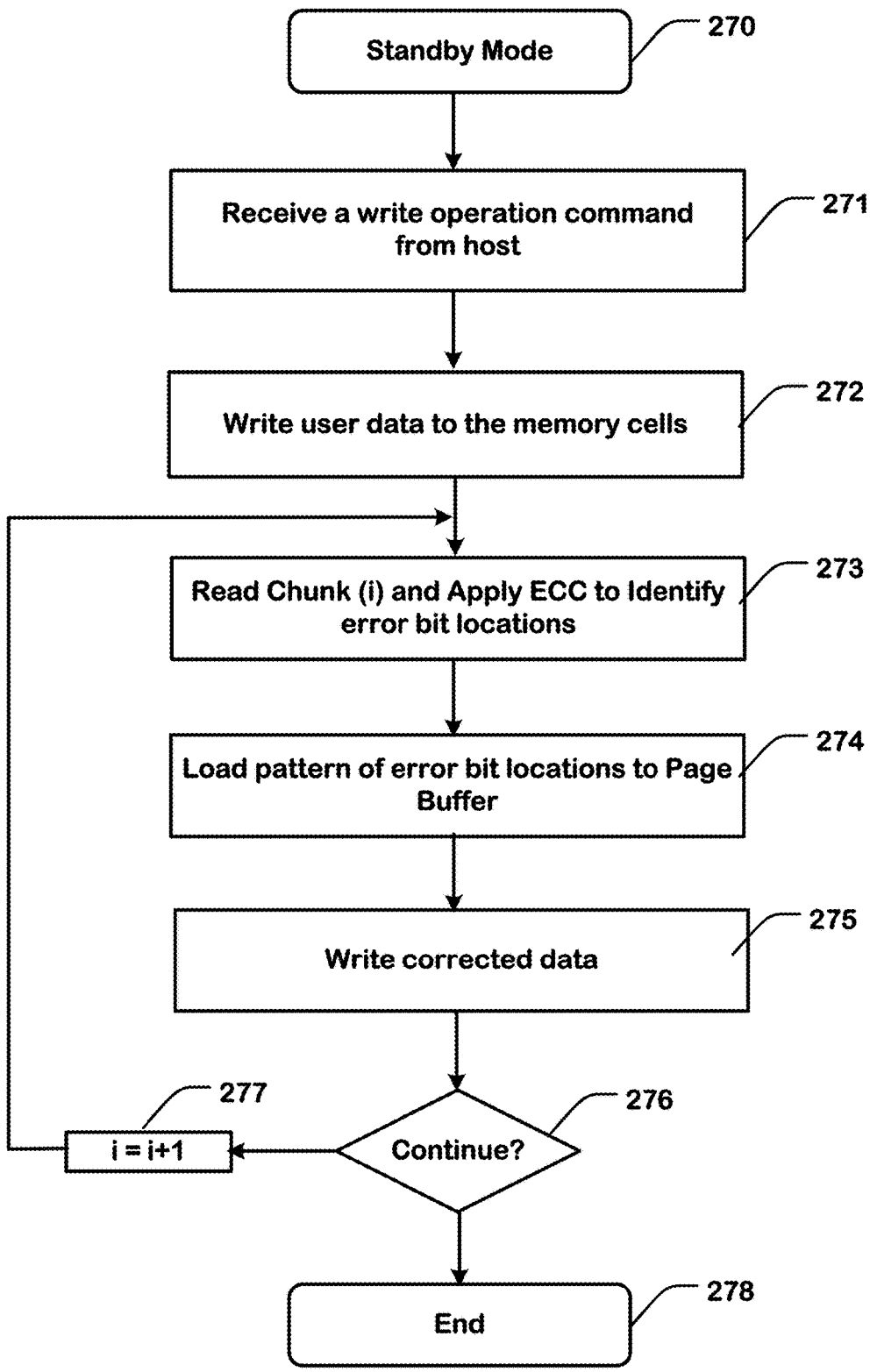
FIG. 5 is a flowchart of a recovery procedure executed by control logic according to another embodiment described herein.

FIG. 5 illustrates a recovery procedure executed in an embodiment in which the integrated circuit includes an interface to receive commands from an external host, and logic to execute a write procedure in response to a command from the external host directed to a write operation region of the memory array. In this embodiment, the control logic executes the recovery procedure in response to a current instance of the write procedure. For example, the recovery procedure can be executing in response to the current instance by performing set-up steps in the control logic, and initiating the operation at a set-up time, upon detection by the command logic of the write command. In this embodiment, the control logic identifies a recovery operation region in the memory array that is different than the write operation region of the current instance of the write procedure. Also, the recovery operation selects the data chunk for a recovery procedure from the recovery operation region. The recovery operation can proceed sequentially through the data chunks in the recovery operation region. The recovery operation in this example can be executed before the current instance of the write operation, after the current instance of the write operation, or concurrently with the current instance of the write operation in various embodiments.

Thus, as illustrated in FIG. 5, the memory controller can begin in a standby mode for example (270). The controller can receive a write operation command from an external host (271). The controller executes an instance of an embedded write procedure to write user data to the memory cells in an identified write operation region of the memory array (272). After completion of the current instance of the embedded write procedure, or at another time set up in response to the current instance, the recovery procedure is instituted. The recovery procedure in this embodiment identifies a recovery operation region that is different than the write operation region. The recovery procedure can use an address pointer that identifies a chunk labeled "chunk (i)" in the diagram, of data within the identified recovery operation region of the memory, to access a selected chunk and the corresponding error correction code from the memory array. The recovery procedure can utilize the ECC logic to identify error bit locations in the selected chunk (block 273). The recovery procedure can load a pattern of error bit locations into the page buffer or other store (274). The recovery procedure can then write corrected data to the identified locations (275). After writing corrected data for the current chunk, a recovery procedure can determine whether to continue to a next chunk (block 276). This determination can be based on the recovery parameters stored in the integrated circuit, such as parameters identifying the extent of the recovery operation region to be traversed in the current instance of the recovery procedure, parameters identifying a time interval within which the recovery procedure is allowed to execute, or other parameters as suits a particular implementation.

If it is decided to continue with the recovery procedure, then an index "i" is incremented (277), and the procedure loops back to block 273 to continue until the current instance of the recovery procedure is completed. If it is decided at block 105 that the current instance of the recovery procedure is completed, then the recovery procedure ends (278). After the recovery procedure ends, the controller can return to a standby mode, or other appropriate operating mode.

In one example of the present technology, a write procedure can be characterized by a time duration specification during which the controller will not accept commands from an external host, or during which an interruption procedure for the write operation would be required to execute such commands. The logic in the controller to execute the recovery procedure in response to a current instance of a write procedure can sequentially apply the recovery procedure to a plurality of data chunks in the recovery operation region in response to the current instance of the write procedure, within the time duration specification for the write procedure. For example, if a write operation is specified to write a block of 256 bytes of data, then the write operation may complete with a window on the order of tens of microseconds before the end of the time duration specification. Within this excess tens of microseconds, the recovery procedure can be applied to a recovery operation region of for example 64 bytes or 128 bytes, depending on the particular implementation. For a longer write operation for a large block of data, a longer window for execution of the recovery operation may be available. Thus, for example, if the write operation region for the write block is on the order of 4 kilobytes (KB), then there may be a window of tens of milliseconds for the recovery procedure, allowing recovery of on the order of 1 KB or 2 KB. For a sector erase command in a flash memory device, the time duration specification for the write can be about 40 milliseconds, while the time needed to complete the erase operation may be around 25 milliseconds. This would leave a window of about 15 milliseconds within which to complete the recovery procedure. For a block erase command in a representative flash memory device, the write time specification may be about 300 milliseconds, but require only around 250 milliseconds for completion. This would leave a window of about 50 milliseconds for the purposes of a recovery operation.

Thus, the logic at block 276, can determine an amount of time available within the time duration specification for the current instance of the write procedure, and decide whether to continue with the recovery operation or not based on the available time window.

Alternatively, the recovery procedure can include a step of computing the extent of the recovery operation region in the memory in response to the extent of the current instance of the write operation. In this case, the logic at block 276 can compare the current pointer used for accessing a chunk of data, with the endpoint of the computed recovery operation region to determine whether to continue.

Figure 6A:
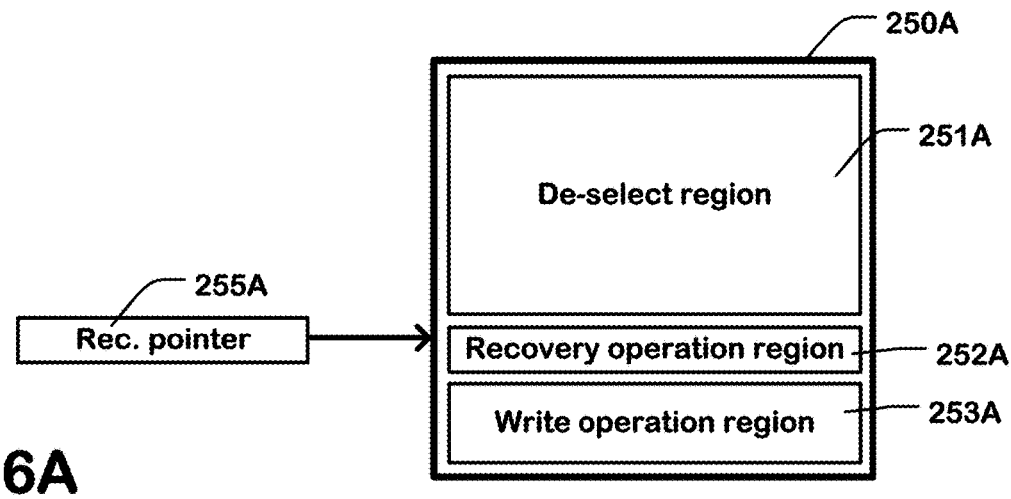
FIGS. 6A, 6B and 6C are heuristic diagrams illustrating a relationship between a write operation region and a recovery operation region for procedures like those described with reference to FIG. 5.
Figure 6B:
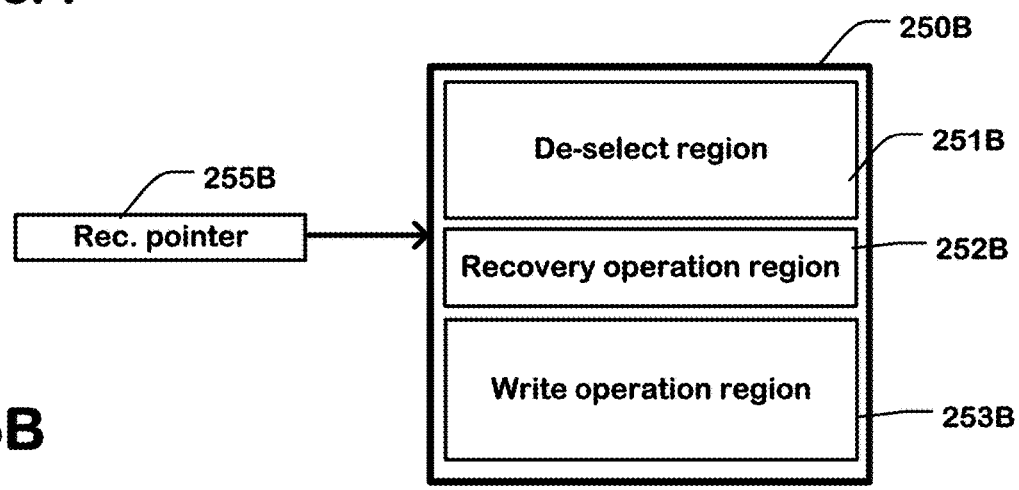
Figure 6C:
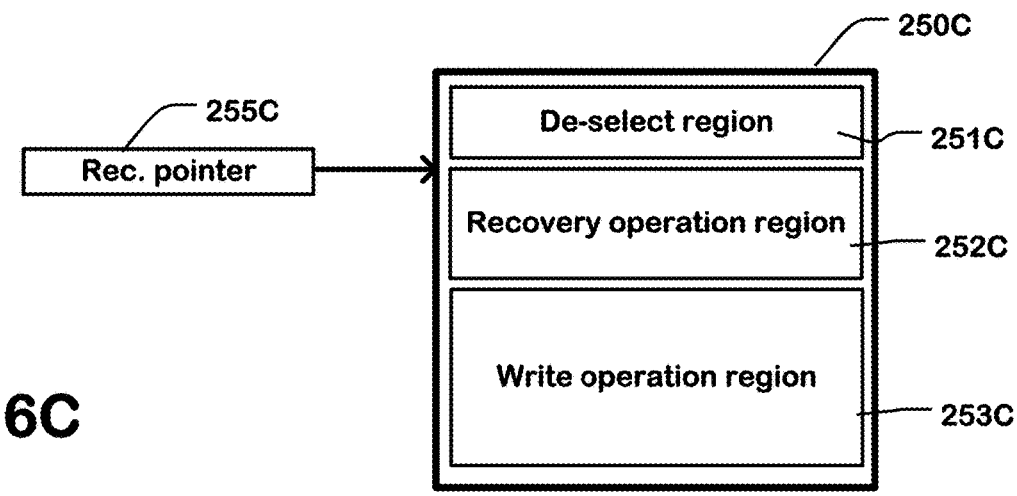

FIGS. 6A-6C illustrate the logic of determining a recovery operation region for a recovery procedure that is executed in response to a particular instance of a write procedure. Thus, FIG. 6A illustrates a memory array address space 250A. A write command can identify a write operation region 253A for a current instance of a write procedure. The controller on the integrated circuit can compute a recovery operation region 252A that is different than the write operation region 253A, but that has a size that is a function of the size of the write operation region 253A. The controller can generate and maintain a recovery pointer 255A, utilized to select a current chunk to access for the recovery procedure, and to traverse the recovery operation region as the procedure continues. The balance of the array is a deselected region 251A, not involved in the current instance of the write operation procedure or the recovery procedure.

FIG. 6B illustrates a memory array address space 250B. A write command can identify a write operation region 253B for a current instance of a write procedure. As illustrated by the scale in the Figure, the size of the write operation region 253B of FIG. 6B is greater than the size of the write operation region 253A of FIG. 6A. The controller on the integrated circuit can compute a recovery operation region 252B that is different than the write operation region 253B, but that has a size that is a function of the size of the write operation region 253B. The size of the recovery operation region 252B in FIG. 6B is greater than the size of the recovery operation region 252A in FIG. 6A because the corresponding write operation region is also larger. The controller can generate and maintain a recovery pointer 255B, utilized to select a current chunk to access for the recovery procedure, and to traverse the recovery operation region as the procedure continues. The balance of the array is a deselected region 251B, not involved in the current instance of the write operation procedure or the recovery procedure.

FIG. 6C illustrates a memory array address space 250C. A write command can identify a write operation region 253C for a current instance of a write procedure. As illustrated by the scale in the Figure, the size of the write operation region 253C of FIG. 6C is greater than the size of the write operation region 253A of FIG. 6A and the write operation region 253B in FIG. 6B. The controller on the integrated circuit can compute a recovery operation region 252C that is different than the write operation region 253C, but that has a size that is a function of the size of the write operation region 253C. The size of the recovery operation region 252C in FIG. 6C is greater than the size of the recovery operation region 252A in FIG. 6A and the recovery operation region 252B in FIG. 6B because the corresponding write operation region is also larger. The controller can generate and maintain a recovery pointer 255C, utilized to select a current chunk to access for the recovery procedure, and to traverse the recovery operation region as the procedure continues. The balance of the array is a deselected region 251C, not involved in the current instance of the write operation procedure or the recovery procedure.

Figure 7:
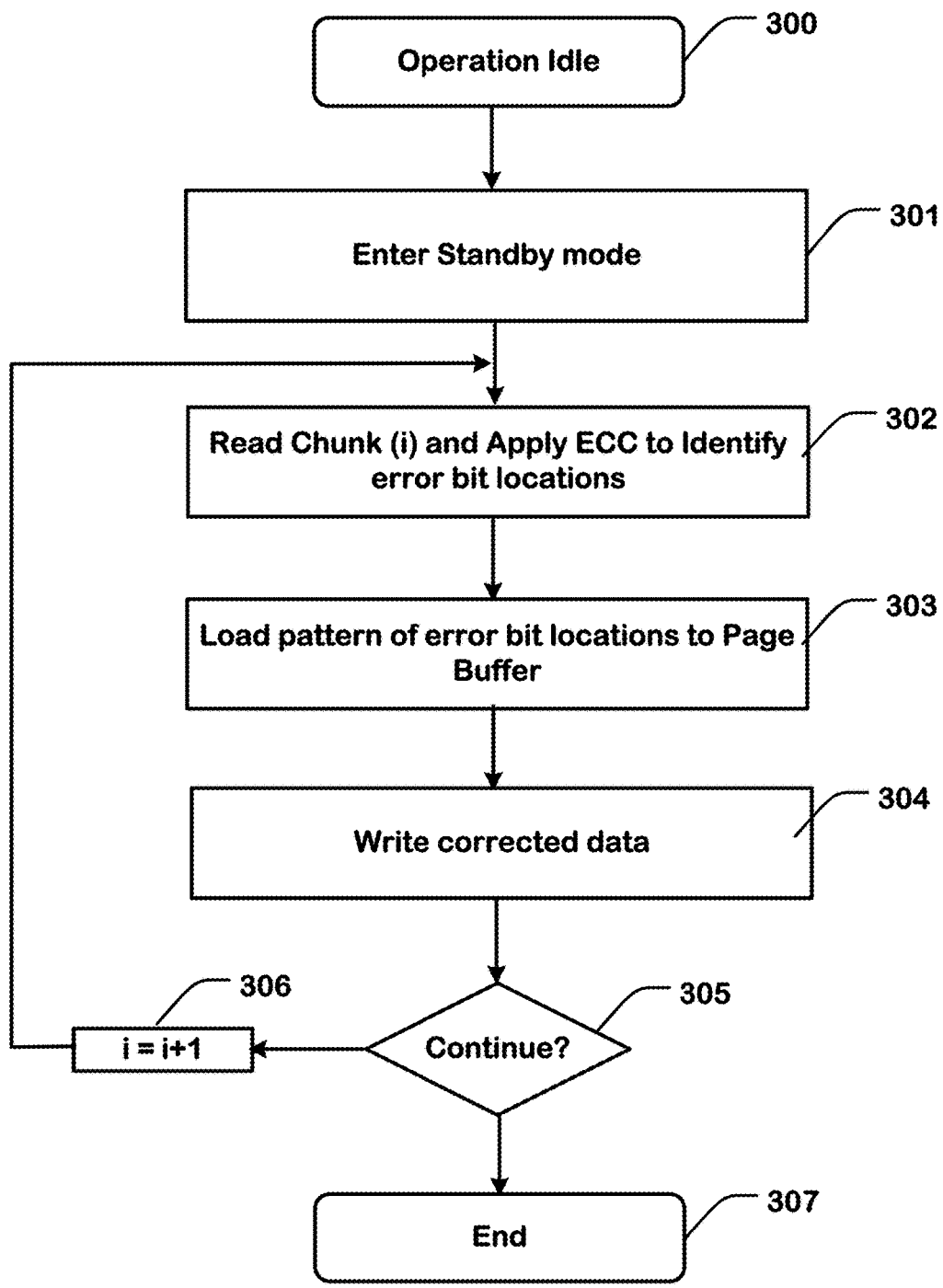
FIG. 7 is a flowchart of a recovery procedure executed by control logic according to yet another embodiment described herein.

FIG. 7 illustrates a recovery procedure for an embodiment in which the integrated circuit includes an interface to receive commands from an external host, and logic to execute read and write procedures in response to commands from the external host. Also, in this embodiment, the controller on the integrated circuit is configured to enter a standby mode between read and write procedures. The control logic in the controller to execute the recovery procedure applies the recovery procedure during the standby mode.

In this example, the controller may begin in an idle state after completion of a read or write procedure (300). From the idle state, the controller may enter a standby mode (301). During the standby mode, the recovery procedure is instituted automatically by the control logic on the integrated circuit. The recovery procedure, in this embodiment, identifies a recovery operation region that can be identified by parameters stored on the integrated circuit as described above. The recovery procedure can use an address pointer that identifies a chunk, labeled "chunk (i)" in the diagram, of data within the identified recovery operation region of the memory, to access a selected chunk and the corresponding error correction code from the memory array. The recovery procedure can utilize the ECC logic to identify error bit locations in the selected chunk (block 302). The recovery procedure can load a pattern of error bit locations into the page buffer or other store (303). The recovery procedure can then write corrected data to the identified locations (304). After writing corrected data for the current chunk, the recovery procedure can determine whether to continue to a next chunk (block 305). This determination can be based on the recovery parameters stored in the integrated circuit, such as parameters identifying the extent of the recovery operation region to be traversed in the current instance of the recovery procedure, parameters identifying a time interval within which the recovery procedure is allowed to execute, or other parameters as suits a particular implementation. Also, the determination can be based on whether the controller has received a command from an external host to execute another operation.

If it is decided to continue with the recovery procedure, then an index "i" is incremented (306), and the procedure loops back to block 302 to continue until the current instance of the recovery procedure is completed. If it is decided at block 305 that the current instance of the recovery procedure is completed, then the recovery procedure ends (307). After the recovery procedure ends, the controller can return to a standby mode, or other appropriate operating mode.

In the embodiment of FIG. 7, the recovery procedure can execute in the background, and can be interrupted or stopped at almost any time, without impacting performance of mission function reads and writes for memory. Also, the controller can maintain parameters that identify the recovery status of regions of the memory, and traverse the entire memory array over time.

Figure 8A:
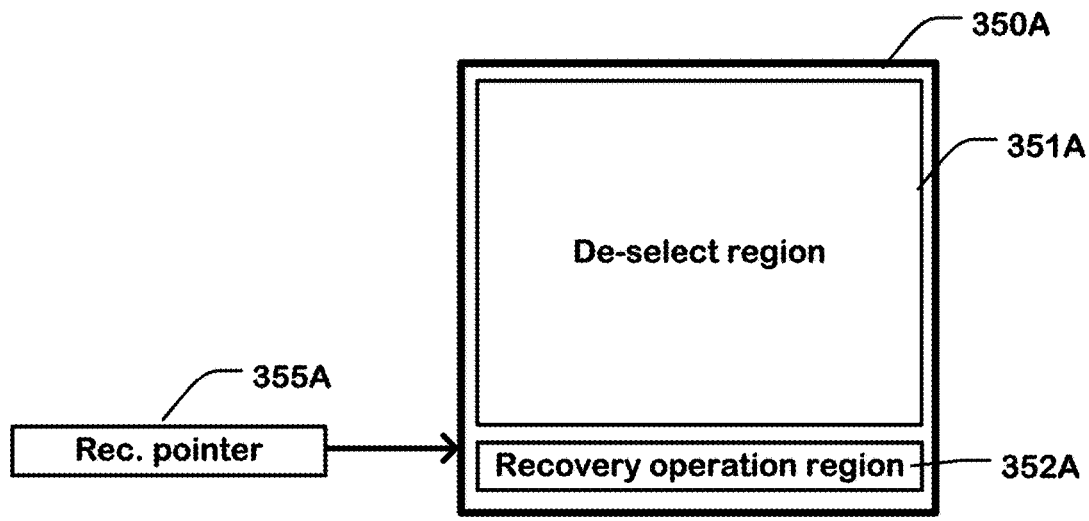
FIGS. 8A, 8B and 8C are heuristic diagrams illustrating a relationship between a write operation region and a recovery operation region for procedures like those described with reference to FIG. 7.
Figure 8B:
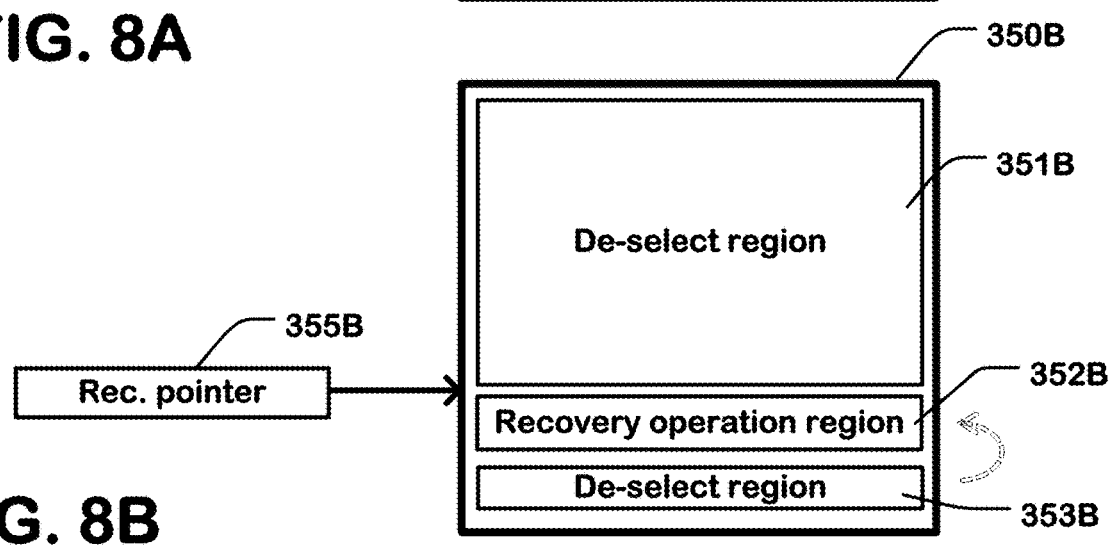
Figure 8C:
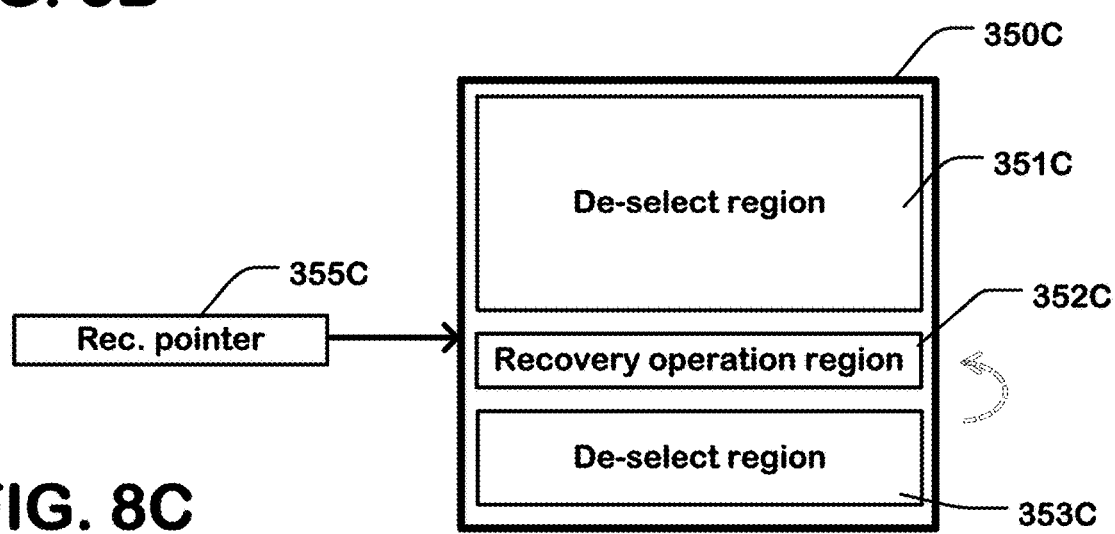

FIGS. 8A-8C illustrate the logic of determining a recovery operation region for a recovery procedure that is executed as discussed with reference to FIG. 7. Thus, FIG. 8A illustrates a memory array address space 350A. The controller on the integrated circuit can compute a recovery operation region 352A, having a predetermined size, and starting at a bottom portion of the array 350A. The controller can generate and maintain a recovery pointer 355A, utilized to select a current chunk to access for the recovery procedure, and to traverse the recovery operation region as the procedure continues. The balance of the array is a deselected region 351A, not involved in the current instance of the recovery procedure.

FIG. 8B illustrates a memory array address space 350B. The controller on the integrated circuit can compute a recovery operation region 352B that is different than the recovery operation region 352A, and adjacent thereto, utilizing status parameters stored on the integrated circuit. The recovery operation region 352B in FIG. 8B can have the same size as the recovery operation region 352A in FIG. 6A in some embodiments. The controller can generate and maintain a recovery pointer 355B, utilized to select a current chunk to access for the recovery procedure, and to traverse the recovery operation region as the procedure continues. The balance of the array includes deselected regions 351B and 353B, not involved in the current instance of the recovery procedure.

FIG. 8C illustrates a memory array address space 350C. The controller on the integrated circuit can compute a recovery operation region 352C that is different than the recovery operation region 352B, and adjacent thereto, utilizing status parameters stored on the integrated circuit. The recovery operation region 352C in FIG. 8C can have the same size as the recovery operation region 352A in FIG. 6A in some embodiments. The controller can generate and maintain a recovery pointer 355C, utilized to select a current chunk to access for the recovery procedure, and to traverse the recovery operation region as the procedure continues. The balance of the array includes deselected regions 351C and 353C, not involved in the current instance of the recovery procedure. The recovery operation can be applied to the entire array 350C over time, using parameters maintained by the controller.

Figure 9:
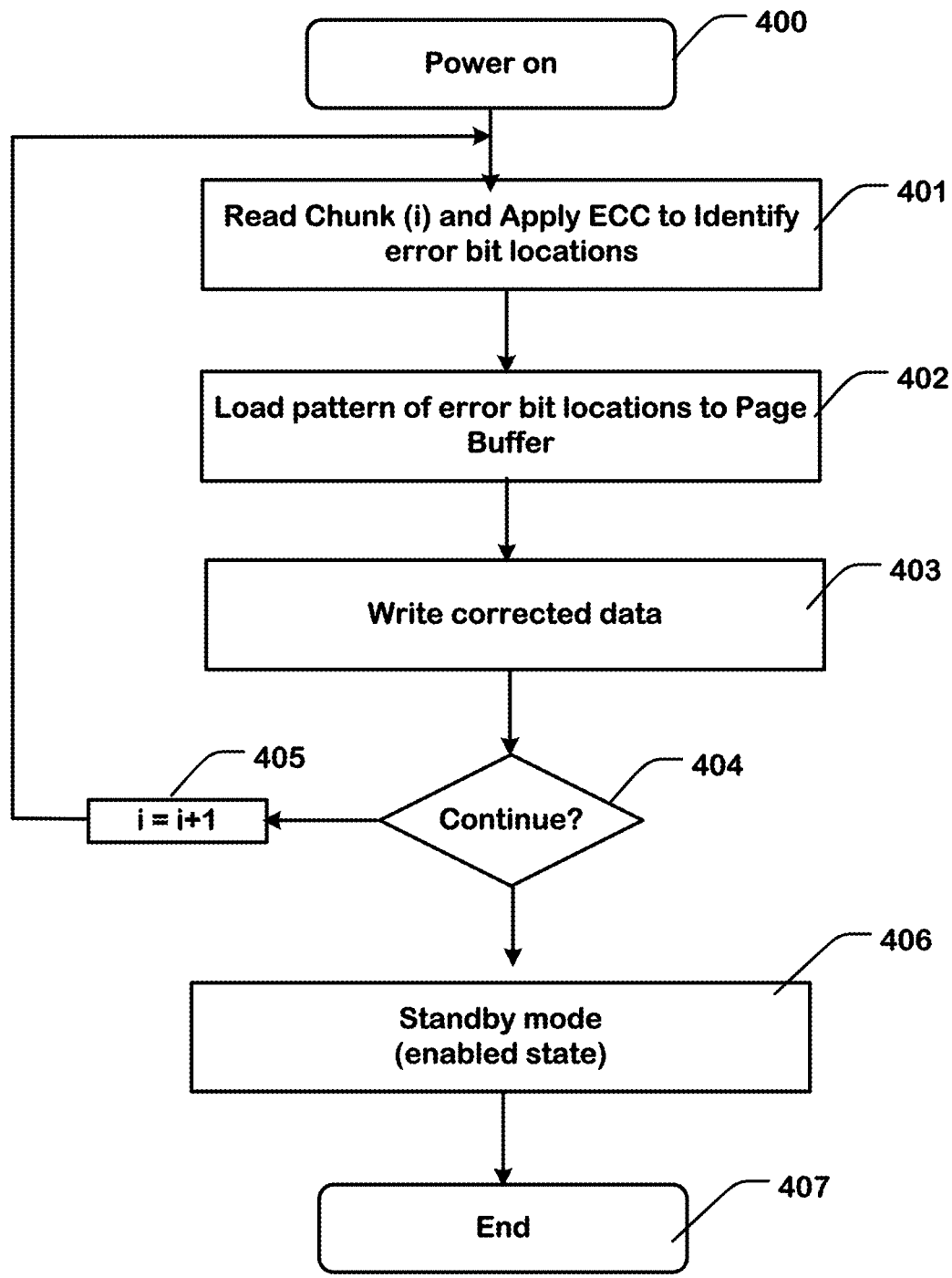
FIG. 9 is a flowchart of a recovery procedure executed by control logic according to an additional embodiment described herein.

FIG. 9 illustrates a recovery procedure for an embodiment in which the integrated circuit includes logic to execute a power-on procedure to enter an enabled state, such as a standby mode after a loss-of-power event. Also, in this embodiment, the controller on the integrated circuit is configured to enter an enabled state, such as a standby mode, in a power-on procedure. The control logic in the controller to execute the recovery procedure applies the recovery procedure during the power-on procedure, before entering the enable state in which commands from an external host will be accepted.

In this example, the controller may begin upon detection of a power-on event (400). During the power-on procedures, the controller is enabled to execute an embedded recovery procedure and the recovery procedure is instituted. The recovery procedure in this embodiment identifies a recovery operation region that can be identified by parameters stored on the integrated circuit as described above. The recovery procedure can use an address pointer that identifies a chunk, labeled "chunk (i)" in the diagram, of data within the identified recovery operation region of the memory, to access a selected chunk and the corresponding error correction code from the memory array. The recovery procedure can utilize the ECC logic to identify error bit locations in the selected chunk (block 401). The recovery procedure can load a pattern of error bit locations into the page buffer or other store (402). The recovery procedure can then write corrected data to the identified locations (403). After writing corrected data for the current chunk, the recovery procedure can determine whether to continue to a next chunk (block 404). This determination can be based on the recovery parameters stored in the integrated circuit, such as parameters identifying the extent of the recovery operation region to be traversed in the current instance of the recovery procedure, parameters identifying a time interval within which the recovery procedure is allowed to execute, or other parameters as suits a particular implementation. In one embodiment, the recovery procedure executed in response to a power-on event traverses the entire memory array. In other embodiments, it traverses specified portions of the memory array. In other embodiments, it traverses recovery operation regions in the manner discussed with reference to FIGS. 8A-8C.

If it is decided to continue with the recovery procedure, then an index "i" is incremented (405), and the procedure loops back to block 401 to continue until the current instance of the recovery procedure is completed. If it is decided at block 404 that the current instance of the recovery procedure is completed, then the controller can enter standby mode, or other appropriate operating mode (406). When the controller enters the standby mode, the recovery procedure is competed (407).

In the embodiment of FIG. 9, the recovery procedure can execute in advance of utilization of the data in the memory after the loss-of-power event as a foreground operation that may increase the latency encountered by the host after the power-on event. However, the condition of the data can be improved to increase reliability of mission function reads.

A number of flowcharts illustrating procedures executed by logic on a memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel, or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

What is claimed is:

1. An integrated circuit, comprising:
a memory array configured to store data chunks with corresponding error correction codes;
error correction logic on the integrated circuit to process data chunks received from the memory array using the corresponding error correction codes to identify locations of errors in the received data chunks; and
control logic on the integrated circuit that executes a recovery procedure to access a selected data chunk and corresponding error correction code from the memory array, to utilize the error correction logic to feedback a location in the memory array of an error bit in the selected data chunk, and the recovery procedure includes applying write bias pulse to the identified location to correct the error bit.

2. The integrated circuit of claim 1, including a page buffer, and write logic coupled to the page buffer to perform write and verify procedures using the page buffer in response to write commands to store data chunks in the memory array; and
wherein the recovery procedure loads the error bit location in the page buffer to identify the location in the memory array of the error bit in the selected data chunk, and applies the write bias pulse and a verify cycle to write corrected data using the page buffer.

3. The integrated circuit of claim 1, wherein the control logic that executes the recovery procedure includes logic to sequentially apply the recovery procedure to a plurality of data chunks.

4. An integrated circuit, comprising:
a memory array configured to store data chunks with corresponding error correction codes;
error correction logic on the integrated circuit to process data chunks received from the memory array using the corresponding error correction codes to identify locations of errors in the received data chunks; and
control logic on the integrated circuit that executes a recovery procedure to access a selected data chunk and corresponding error correction code from the memory array, to utilize the error correction logic to identify a location in the memory array of an error bit in the selected data chunk, and to access the identified location to write corrected data, wherein the control logic that executes the recovery procedure includes logic to maintain one or more recovery parameters identifying a recovery operation region in the memory array, and to sequentially apply the recovery procedure to a plurality of data chunks in the recovery operation region.

5. The integrated circuit of claim 1, wherein the memory array comprises non-volatile memory.

6. The integrated circuit of claim 1, wherein the integrated circuit includes an interface to receive commands from an external host, and logic to execute a write procedure in response to a command from the external host to a write operation region of the memory array, and wherein the control logic to execute the recovery procedure is responsive to a current instance of the write procedure, to identify a recovery operation region different than the write operation region in the memory array, and to select the data chunk for the recovery procedure from the recovery operation region.

7. The integrated circuit of claim 6, wherein the write procedure is characterized by a time duration specification including excess time for at least some instances of the write procedure, and the control logic includes logic to sequentially apply the recovery procedure to a plurality of data chunks in the recovery operation region in response to the current instance within the time duration specification.

8. The integrated circuit of claim 6, wherein instances of the write procedure write blocks of data having different sizes, and the size of the recovery operation region is a function of size of the block of the current instance.

9. The integrated circuit of claim 1, wherein the integrated circuit includes an interface to receive commands from an external host, and logic to execute read and write procedures in response to commands from the external host, and to enter a standby mode between read and write procedures, and wherein the control logic to execute the recovery procedure applies the recovery procedure during the standby mode.

10. The integrated circuit of claim 1, wherein the integrated circuit includes logic to execute a power-on process after interruption in power applied to the integrated circuit which results in entering an enabled state, and wherein the control logic to execute the recovery procedure applies the recovery procedure as a part of the power-on process before entering the enabled state.

11. The integrated circuit of claim 1, wherein the integrated circuit includes an interface to receive commands from an external host, and wherein the control logic is responsive to a recovery operation command from an external host to execute the recovery procedure.

12. A method for operating a memory on an integrated circuit, comprising:
storing data chunks with corresponding error correction codes in the memory; and
executing a recovery procedure to access a selected data chunk and corresponding error correction code from the memory, to utilize error correction logic on the integrated circuit to feedback a location in the memory of an error bit in the selected data chunk, and to apply a write bias pulse to the identified location to correct the error bit.

13. The method of claim 12, wherein the recovery procedure includes loading from error correction logic on the integrated circuit, the error bit location in a page buffer to identify the location in the memory of the error bit in the selected data chunk, and applying the write bias pulse and a verify cycle to write corrected data using the page buffer.

14. The method of claim 12, including sequentially applying the recovery procedure to a plurality of data chunks.

15. The method of claim 12, including maintaining one or more recovery parameters on the integrated circuit identifying a recovery operation region in the memory, and sequentially applying the recovery procedure to a plurality of data chunks in the recovery operation region.

16. The method of claim 12, wherein the memory comprises non-volatile memory.

17. The method of claim 12, including executing a current instance of a write procedure in response to a command from an external host to a write operation region of the memory, and responsive to the current instance of the write procedure, identifying a recovery operation region different than the write operation region in the memory, and sequentially applying the recovery procedure to a plurality of data chunks in the recovery operation region.

18. The method of claim 17, wherein the write procedure is characterized by a time duration specification including excess time for at least some instances of the write procedure, and sequentially applying the recovery procedure to a plurality of data chunks in the recovery operation region in response to the current instance of the write procedure within the time duration specification.

19. The method of claim 17, wherein instances of the write procedure write blocks of data having different sizes, and the size of the recovery operation region is a function of size of the block of the current instance.

20. The method of claim 12, wherein the integrated circuit includes an interface to receive commands from an external host, and logic to execute read and write procedures in response to commands from the external host, and to enter a standby mode between read and write procedures, and including applying the recovery procedure during the standby mode.

21. The method of claim 12, wherein the integrated circuit includes logic to execute a power-on process after interruption in power applied to the integrated circuit which results in entering an enabled state, and including applying the recovery procedure as a part of the power-on process before entering the enabled state.

22. The method of claim 12, including executing the recovery procedure in response to a recovery operation command from an external host.

* * * * *